(12) United States Patent
Ikeda

(10) Patent No.: US 6,900,698 B2
(45) Date of Patent: May 31, 2005

(54) NEGATIVE FEEDBACK AMPLIFIER WITH ELECTROSTATIC DISCHARGE PROTECTION CIRCUIT

(75) Inventor: Hitoshi Ikeda, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 33 days.

(21) Appl. No.: 10/618,601

(22) Filed: Jul. 15, 2003

(65) Prior Publication Data

US 2004/0140849 A1 Jul. 22, 2004

(30) Foreign Application Priority Data

Jan. 17, 2003 (JP) ........................................ 2003-009085

(51) Int. Cl.[7] .............................................. H03F 3/52
(52) U.S. Cl. ..................................... 330/298; 330/110
(58) Field of Search ........................ 327/312; 330/110, 330/207 P, 290, 298

(56) References Cited

U.S. PATENT DOCUMENTS 6,204,715 B1 * 3/2001 Sellnau et al. .............. 327/309

2003/0102923 A1 * 6/2003 Vickram et al. ............ 330/298

FOREIGN PATENT DOCUMENTS

| JP | 1-162922 | 11/1989 |
|---|---|---|
| JP | 08-162858 | 6/1996 |
| JP | 2001-110993 | 4/2001 |

* cited by examiner

Primary Examiner—Steven J. Mottola
(74) Attorney, Agent, or Firm—Volentine Francos & Whitt, PLLC

(57) ABSTRACT

A negative feedback amplifier which alleviates reduction in band width and effectively protects an amplifier from electrostatic discharge (ESD). A node is provided at the midpoint of a feedback resistor connected between an output terminal and an input terminal of an amplifier. Each of ESD protective diodes are connected between the node and respective power terminals. ESD threshold voltage and band width vary in accordance with the resistance of a resistor between the input terminal and the node. Setting the resistance of the resistor at 10 to 100Ω makes it possible to secure the necessary ESD threshold voltage while hardly reducing band width.

22 Claims, 4 Drawing Sheets

NEGATIVE FEEDBACK AMPLIFIER WITH ELECTROSTATIC DISCHARGE PROTECTION CIRCUIT

BACKGROUND OF THE INVENTION

1. Field of the Invention

The present invention relates to a negative feedback amplifier used in a high-speed optical fiber communication system and the like, and especially the present invention relates to technology for increasing the reliability of the negative feedback amplifier.

2. Description of the Related Art

Electrostatic Discharge (ESD) causing damage to a semiconductor device occurs in a circuit or an electrical insulator, which is different from the semiconductor device, and which is for example installed in equipment having the semiconductor device, or which may be a body of a human who handles the semiconductor device, and the like. The ESD is an important factor which affects the reliability of the semiconductor device. Accordingly, it is preferable to sufficiently increase threshold voltage to the ESD, for the purpose of securing stable operation.

A transistor for amplification positioned in an input section especially sustains the damage from ESD. The damage is generally considered as heat damage. In other words, electric current flows through a junction between an electrode metal plate and the semiconductor device due to the addition of ESD. Since the electric current increases the temperature of the junction, the resistance thereof decreases and causes overheating. Then, the junction is damaged by melting.

In order to protect the semiconductor device from the ESD, a method by which a Zener diode or the like is disposed in the input or output of an amplifier is conventionally adopted, where the Zener diode is designed so as to operate with a voltage more than a predetermined voltage FIGS. 1A to 1C are explanatory views of a conventional electrostatic protective circuit for the amplifier.

In FIG. 1A, diodes 4 and 5 are connected between an input terminal of the amplifier (AMP) 1 to be protected and a positive power terminal 2, and between the input terminal and a negative power terminal 3, respectively, in such a manner that the diodes 4 and 5 are biased in opposite directions. Accordingly, when the ESD is applied to the input terminal, the amplifier 1 is protected from the ESD because the diode 4 or 5 is conducting. However, there is a problem that the capacitance of the diodes 4 and 5, connected between the input terminal of the amplifiers 1 and the power terminals 2 and 3, adversely affects high-frequency characteristics.

Japanese Patent Laid-Open Publication No. 2001-110993 discloses electrostatic protective circuits which protect the semiconductor device from the ESD without impairing the high-frequency characteristic. FIGS. 1B and 1C show these electrostatic protective circuits.

In the electrostatic protective circuit shown in FIG. 1B, cathodes of protective diodes 6 and 7 are connected to the input terminal of the amplifier 1, which is to be protected and is composed of High Electron Mobility Transistors (HEMTs). The anode of the diode 6 is connected to the positive power terminal 2 while the anode of the diode 7 is connected to the negative power terminal 3. These diodes 6 and 7 are composed of a plurality of Schottky diodes connected in series, in such a manner as to be in an off-state when normal input signals are inputted. The Schottky diode includes a HEMT formed in the same process as the amplifier 1. In the Schottky diode, the source and the drain of the HEMT short out.

In the electrostatic protective circuit shown in FIG. 1C, the cathodes of the diodes 6 and 7 are not directly connected to the input terminal, but connected via a diode 8. The configuration of the electrostatic protective circuits like this makes it possible to improve the ESD resistance without impairing the characteristics of a high-frequency device.

The conventional electrostatic protective circuit, however, has the following problem.

In a high-speed optical fiber communication system, for example, optical signals carried by optical fibers are converted into current signals by a photoelectric conversion element such as a photodiode and the like. A negative feedback amplifier converts the current signals into voltages, and amplifies them. The negative feedback amplifier requires characteristics such as low noise, a high dynamic range, high bandwidth, and high gain. An amplifier called a trans impedance type amplifier, in which a feedback resistor is connected between an input and an output, is generally used as the negative feedback amplifier.

By the way, the band width fw of the negative feedback amplifier is expressed by the following equation:

$$fw = A/(2\pi \cdot Rf \cdot Cin),$$

wherein A is the open-loop gain of the amplifier, Rf is feedback resistance, and Cin is input capacitance. The input capacitance Cin is the total of "the junction capacitance of the photodiode and the like", "the input capacitance of the amplifier", and "stray capacitance added by mounting".

Taking a case of a negative feedback amplifier operating at the level of 10 Gbps, for example, the junction capacitance of a generally used photodiode is about 150 fF (femto-Farad), the input capacitance of an amplifier is 50 to 100 fF, and the stray capacitance is several tens of fF. The total input resistance Cin of these is approximately 200 to 300 fF.

When the electrostatic protective circuits shown in FIGS. 1A to 1C are added in the negative feedback amplifier, the input resistance Cin is more than doubled because the capacitance of the protective diode itself is more than several hundreds of fF. Thus, it is difficult to obtain the desired band width fw.

SUMMARY OF THE INVENTION

An object of the present invention is to provide a negative feedback amplifier in which an amplifier is effectively protected from ESD with small reduction in a band width fw.

To achieve the above object, a negative feedback amplifier according to the present invention has a feedback resistor connected between an output terminal and an input terminal of an amplifier, which is powered from first and second power terminals. The negative feedback amplifier comprises a division node, a first diode, and a second diode. The division node divides the feedback resistor into a first resistor on the side of the input terminal, and a second resistor on the side of the output terminal. The first diode has a first electrode (anode) connected to the first power terminal, and a second electrode (cathode) connected to the division node. The second diode has a first electrode connected to the second power terminal, and a second electrode connected to the division node.

According to the present invention the following effect can be obtained due to the configuration of the negative feedback amplifier as described above.

The amplifier and the feedback resistor amplify input signals inputted to the input terminal of the negative feedback amplifier in a manner of a transimpedance type. The first and second diodes are connected between the division node provided at the midpoint of the feedback resistor and the first power terminal, and between the division node and the second power terminal, respectively. Increase in the input capacitance is small due to the divided first resistor, so that decrease in the band width is small. When the ESD is applied to the input terminal, on the other hand, the first or second diode turns into an on-state, so that electric current flows into the first or second power terminal through the diode. Therefore, the amplifier is protected from the ESD.

DETAILED DESCRIPTION OF THE INVENTION (First Embodiment)

Figure 1A:
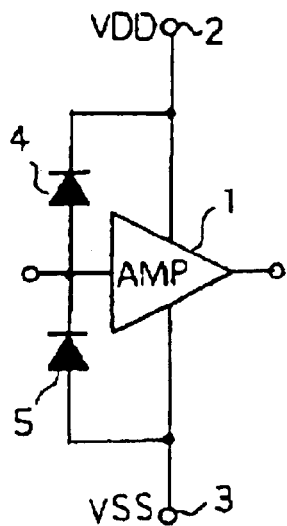
FIGS. 1A to 1C are explanatory views of a conventional electrostatic protective circuit for an amplifier.
Figure 1B:
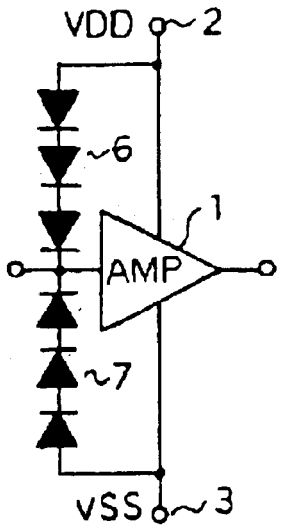
Figure 1C:
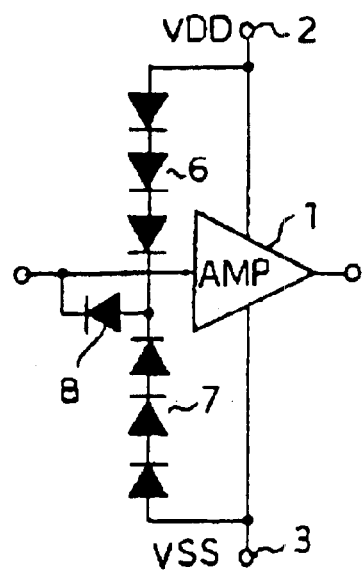
Figure 2:
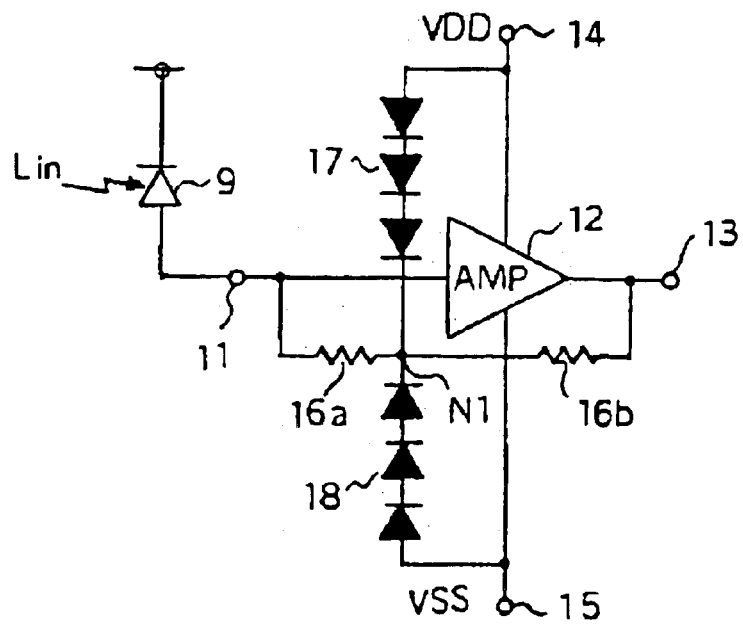
FIG. 2 is a schematic circuit diagram of a negative feedback amplifier according to a first embodiment of the present invention.

FIG. 2 is a schematic circuit diagram of a negative feedback amplifier according to a first embodiment of the present invention.

The negative feedback amplifier is an amplifier for use in a high-speed optical fiber communication system or the like, and which converts optical signals into electronic signals and amplifies the electronic signals. The negative feedback amplifier has an input terminal 11 into which current signals are inputted from a photoelectric conversion element 9 such as a photodiode, the conductivity of which varies in accordance with the intensity of the optical signals Lin. The input terminal 11 is connected to an amplifier (AMP) 12 which is to be protected and is composed of HEMTs. The output of the amplifier 12 is connected to an output terminal 13. Power supply voltages VDD and VSS are applied to the amplifier 12 from a positive power terminal 14 and a negative power terminal 15, respectively.

A feedback resistor comprising resistors 16a and 16b in series is connected between the input terminal 11 and the output terminal 13. One end of the resistor 16a is connected to the input terminal 11, and one end of the resistor 16b is connected to the output terminal 13. The resistors 16a and 16b are connected at a node N1.

The cathodes of protective diodes 17 and 18 are connected to the node N1. The anodes of the diodes 17 and 18 are connected to the positive power terminal 14 and the negative power terminal 15, respectively. The diodes 17 and 18 for ESD protection comprise a plurality of diode elements for bias adjustment connected in series, in such a manner as to be in an off-state when the normal input signals are inputted. The diode elements for bias adjustment, formed in the same process as the amplifier 12, are Schottky diodes in which the gate length of the HEMT is elongated, and the source and the drain thereof short out.

Taking a case where the negative feedback amplifier driven by a single power supply of 5V is designed so that typical bias voltage for input is 2V, a single diode element starts conducting electricity in a forward direction at a voltage of approximately 0.5V. Accordingly, the diodes 17 and 18 have seven and five diode elements connected in series, respectively.

In this embodiment, as described above, the diodes 17 and 18 connected between the node N1 and the respective power supply terminals are composed of a plurality of diode elements connected in series. Therefore, it is possible for the diodes 17 and 18 to function as the diode for ESD protection which is in the off-state during normal operation, and is turned into an on-state in response to ESD.

The negative feedback amplifier operates in the same manner as a conventional amplifier. The current signals, inputted from the photoelectric conversion element 9 to the input terminal 11, are converted into a voltage by passing through the feedback resistors 16a and 16b. A feedback amplifier circuit including the amplifier 12 and the feedback resistors 16a and 16b amplifies the voltage, and the amplified voltage is outputted to the output terminal 13. Since the diodes 17 and 18 for ESD protection are connected to the input terminal 11 through the resistor 16a, increase in input capacitance due to the diodes 17 and 18 is reduced, as compared with a case where the diodes 17 and 18 are connected directly between the input terminal 11 and the power terminals 14 and 15.

When a negative ESD voltage (−400V, for example) is applied to the input terminal 11, on the other hand, the protective diode 17 or 18 is turned into the on-state, so that electric current flows into the input terminal 11 through the diode 17 or 18 and the resistor 16a. Accordingly, an ESD voltage applied to the input of the amplifier 12 is lowered. The HEMT used in the input stage of the amplifier 12 has low threshold to negative high voltage, and high threshold to positive high voltage. Therefore, the diodes 17 and 18 make it possible for the amplifier 12 to have the higher threshold to the negative ESD voltage.

To increase ESD threshold, it is effective to reduce the resistance of the resistor 16a. If the resistance of the resistor 16a is reduced, however, the input capacitance becomes large due to the diodes 17 and 18, and a band width becomes narrow. Accordingly, it is necessary to determine the resistance of the resistor 16a in view of both the desired ESD threshold voltage and band width.

Figure 3:
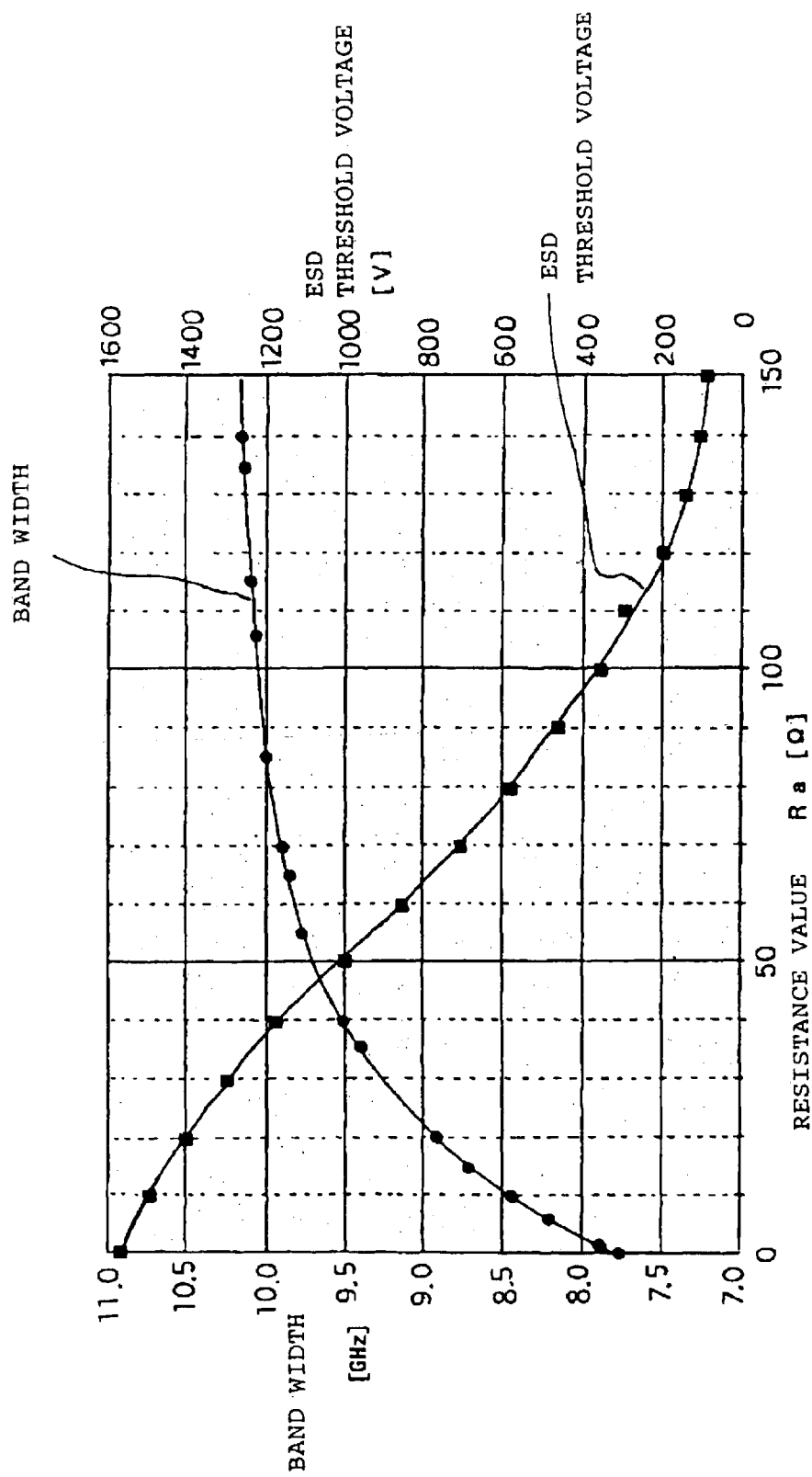
FIG. 3 is a graph showing simulation results of a band width and ESD threshold voltage with varying the resistance of a resistor 16a of FIG. 2.

FIG. 3 is a graph showing simulation results of the band width and the ESD threshold voltage with varying the resistance of a resistor 16a of FIG. 2. The band width is a frequency the gain of which is 3 dB lower than a maximum gain corresponding to a low frequency.

In this simulation, a GaAs/AlGaAs-based HEMT element is used as the amplifier 12. The gate width of the element is 100 $\mu$m and the gate length is 0.1 $\mu$m. The protective diodes 17 and 18, also based on GaAs/AlGaAs, are composed of diode elements connected in series, the Schottky electrode of which (the anode electrode of the diode, namely corresponding to the gate electrode of the HEMT) is 30 $\mu$m×2 $\mu$m. FIG. 3 shows characteristics of the negative feedback amplifier, when the whole resistance Rf of the feedback resistors 16a and 16b is constant (350Ω), and the resistance Ra of the resistor 16a on an input terminal 11 side varies within the range of 0Ω to 150Ω.

If the resistance Ra is equal to or lower than 100Ω, as shown in FIG. 3, a few hundred V or more ESD threshold voltage can be obtained, so that the negative feedback amplifier can function as an electrostatic protective circuit. On the other hand, the lower limit of the resistance Ra is decided according to the desired band width. If the resistance Ra is 10Ω, the band width of 8.5 GHz can be obtained, so that the proper range of the resistance Ra is approximately 10 to 100Ω.

In the negative feedback amplifier according to the first embodiment, as stated above, the protective diodes 17 and 18 are connected between the node N1 at some midpoint of the feedback resistors 16a and 16b and power terminals 14 and 15. Therefore, there is an advantage that the negative feedback amplifier can effectively protect the amplifier 12 from the negative ESD with hardly reducing the band width.

(Second Embodiment)

Figure 4:
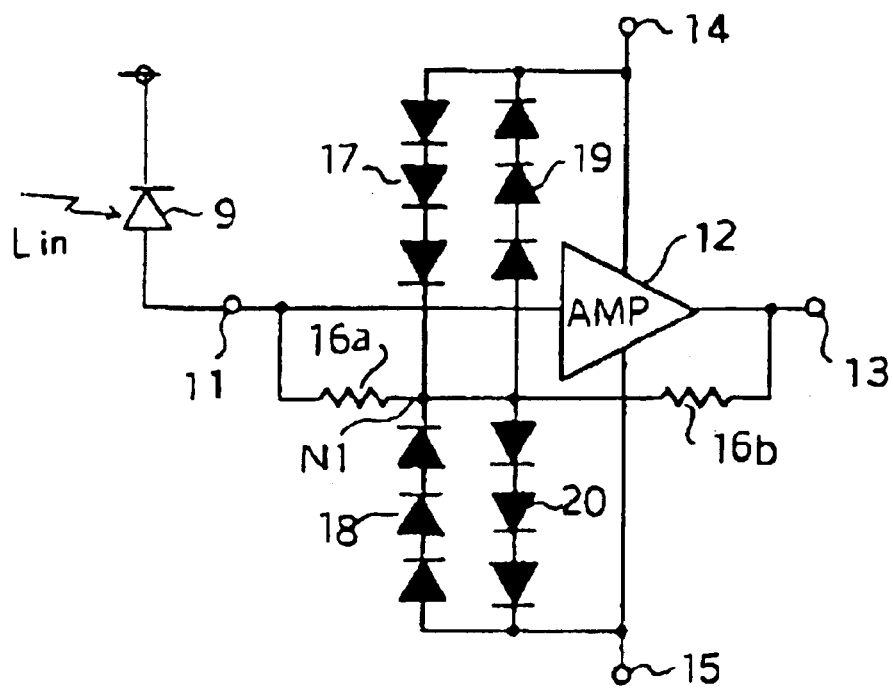
FIG. 4 is a schematic circuit diagram of a negative feedback amplifier according to a second embodiment of the present invention.

FIG. 4 is a schematic circuit diagram of a negative feedback amplifier according to a second embodiment of the present invention. The same reference numerals are assigned to the same elements of FIG. 4 as those of FIG. 2.

The negative feedback amplifier is provided with protective diodes 19 and 20, in addition to the protective diodes 17 and 18 shown in FIG. 2. The protective diodes 19 and 20 are opposite in polarity to the protective diodes 17 and 18. The anodes of the diodes 19 and 20 are connected to the node N1. The cathodes of the diodes 19 and 20 are connected to the positive power terminal 14 and the negative power terminal 15, respectively. The diodes 19 and 20, just as with the diodes 17 and 18, comprise a plurality of Schottky diodes connected in series, in such a manner as to become to be in an off-state when the normal input signals are inputted. In the Schottky diode, the source and the drain of the HEMT, formed in the same process as the amplifier 12, short out.

The negative feedback amplifier operates in the same manner as that of the first embodiment shown in FIG. 2.

When the negative ESD voltage is applied to the input terminal 11, on the other hand, the diode 17 or 18 is turned into the on-state, as in the case of the first embodiment. Then, the electric current flows into the input terminal 11 from the power terminal 14 or 15, through the diode 17 or 18 and the resistor 16a. In the case of the positive ESD voltage, the diode 19 or 20 is turned into the on-state. Then, the electric current flows from the input terminal 11 into the power terminal 14 or 15 through the resistor 16a and the diode 19 or 20. Accordingly, the ESD voltage applied to the input of the amplifier 12 is reduced.

In the negative feedback amplifier according to the second embodiment, as described above, the four units of protective diodes 17 to 20 are connected between the node N1 at some midpoint of the feedback resistors 16a and 16b and power terminals 14 and 15. Therefore, there is an advantage that the amplifier 12 is certainly protected from the ESD irrespective of the polarity of the added ESD voltage, in addition to the advantage according to the first embodiment.

(Third Embodiment)

Figure 5:
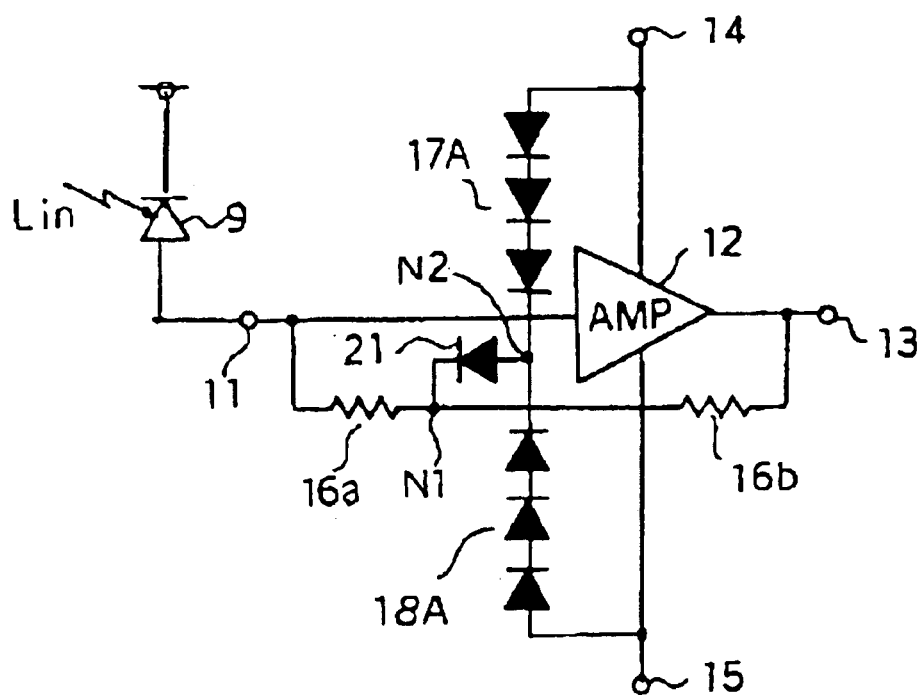
FIG. 5 is a schematic circuit diagram of a negative feedback amplifier according to a third embodiment of the present invention.

FIG. 5 is a schematic circuit diagram of a negative feedback amplifier according to a third embodiment of the present invention. The same reference numerals are assigned to the same elements of FIG. 5 as those of FIG. 2.

The negative feedback amplifier is provided with protective diodes 17A, 18A and 21, instead of the protective diodes 17 and 18 shown in FIG. 2. The protective diodes 17A, 18A, and 21 have slightly different configuration from the protective diodes 17 and 18. The cathodes of the diodes 17A and 18A are connected to the node N2. The anodes of the diodes 17A and 18A are connected to the positive power terminal 14 and the negative power terminal 15, respectively. The anode of the diode 21 is connected to the node N2, and the cathode of the diode 21 is connected to the node N1.

The negative feedback amplifier operates for amplification and ESD protection, in the same manner as that of the first embodiment shown in FIG. 2. In this embodiment, each of the diodes 17A and 18A connected between the node N2 and the power terminals comprises plural diode elements connected in series. These diodes 17A and 18A and the diode 21 compose a diode for ESD protection which is in the off-state during the normal operation, and is turned into the on-state when the ESD voltage is applied.

The negative feedback amplifier according to the third embodiment, as described above, has the common diode 21 connected to both of the diodes 17A and 18A in series. Accordingly, taking a case where the diodes 17 and 18 of FIG. 2 have the seven and five diode elements in series, respectively, for example, the diodes 17A and 18A of FIG. 5 may have the six and four diode elements in series, respectively. Therefore, it is possible to reduce the number of the diode elements necessary for ESD protection, as well as to obtain the same advantage as in the first embodiment.

(Fourth Embodiment)

Figure 6:
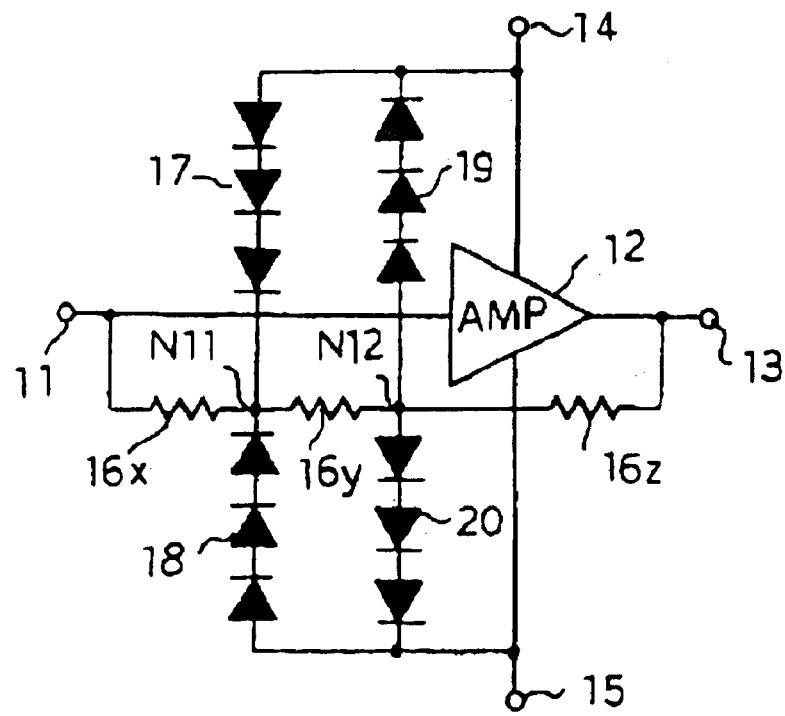
FIG. 6 is a schematic circuit diagram of a negative feedback amplifier according to a fourth embodiment of the present invention.

FIG. 6 is a schematic circuit diagram of a negative feedback amplifier according to a fourth embodiment of the present invention. The same reference numerals are assigned to the same elements of FIG. 6 as those of FIG. 4.

In the negative feedback amplifier of FIG. 6, the feedback resistor comprises three resistors 16x, 16y, and 16z. The resistor 16x is connected between the input terminal 11 and a node N11. The resistor 16y is connected between the node N11 and a node N12, and the resistor 16z is connected between the node N12 and the output terminal 13. The resistance of the resistor 16x is 10 to 100Ω, and the resistance of the resistor 16y is 0 to 100Ω. The total resistance of the three resistors 16x, 16y, and 16z is about 350Ω.

The cathodes of the protective diodes 17 and 18 are connected to the node N11. The anodes of the protective diodes 19 and 20 are connected to the node N12. The other configuration is the same as that shown in FIG. 4.

The negative feedback amplifier operates in the same manner as that of the second embodiment shown in FIG. 4.

When the negative ESD voltage is applied to the input terminal 11, on the other hand, the diode 17 or 18 is turned into the on-state, as in the case of the second embodiment. The electric current flows into the input terminal 11 from the power terminal 14 or 15 through the diode 17 or 18 and the resistor 16x. In the case of the positive ESD voltage, the diode 19 or 20 is turned into the on-state. The electric current flows from the input terminal 11 into the power terminal 14 or 15 through the resistors 16x and 16y and the diode 19 or 20. Accordingly, the ESD voltage applied to the input of the amplifier 12 is reduced.

If the positive and negative ESD voltages the absolute values of which are the same are applied to the input terminal 11, the resistance to the positive ESD voltage applied to the input of the amplifier 12 is higher than that to the negative ESD voltage, because of the difference in resistance between the input terminal 11 and the node N11, and between the input terminal 11 and the node N12. However, as described above, the HEMT used in the input stage of the amplifier 12 has higher threshold to positive high voltage than that to negative high voltage. Therefore, it is possible to provide the negative feedback amplifier with the equal threshold to both of the positive and negative ESD voltages, by means of properly setting the resistance of the resistor 16y.

The influence of the diodes 19 and 20 upon the input capacitance is less than that of FIG. 4, due to the addition of the resistor 16y. Therefore, it is possible to further alleviate the reduction in the band width.

In the negative feedback amplifier according to the fourth embodiment, as described above, the feedback resistor is divided to include three resistors 16x, 16y, and 16z. The cathodes of the protective diodes 17 and 18 are connected to the node N11 near to the input terminal 11, and the anodes of the protective diodes 19 and 20 are connected to the node N12 far from the input terminal 11. Accordingly, there is an advantage that the reduction in the band width is alleviated as compared with the second embodiment, in addition to the advantage that the amplifier 12 is certainly protected from the ESD irrespective of the polarity of the added ESD voltage, as in the case of the second embodiment.

(Fifth Embodiment)

Figure 7:
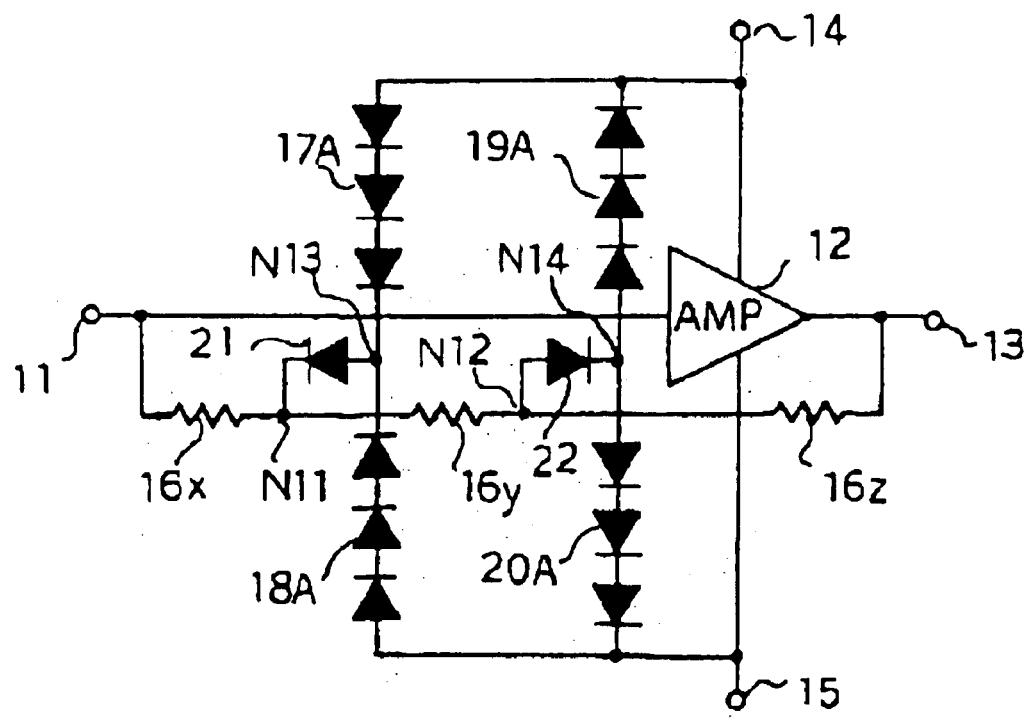
FIG. 7 is a schematic circuit diagram of a negative feedback amplifier according to a fifth embodiment of the present invention.

FIG. 7 is a schematic circuit diagram of a negative feedback amplifier according to a fifth embodiment of the present invention. The same reference numerals are assigned to the same elements of FIG. 7 as those of FIG. 6.

The negative feedback amplifier is provided with protective diodes 17A, 18A, and 21 having the same configuration as those of FIG. 5, instead of the diodes 17 and 18 shown in FIG. 6. The negative feedback amplifier is also provided with protective diodes 19A, 20A, and 22, instead of the diodes 19 and 20. The cathodes of the diodes 17A and 18A are connected to a node N13. The anodes of the diodes 17A and 18A are connected to the positive power terminal 14 and the negative power terminal 15, respectively. The anode of the diode 21 is connected to the node N13, and the cathode of the diode 21 is connected to a node N11.

The anodes of the diodes 19A and 20A are connected to a node N14, and the cathodes of the diodes 19A and 20A are connected to the positive power terminal 14 and the negative power terminal 15, respectively. The cathode of the diode 22 is connected to the node N14, and the anode of the diode 22 is connected to a node N12. The other configuration is the same as the FIG. 6.

The negative feedback amplifier operates in the same manner as that of the fourth embodiment shown in FIG. 6.

When the ESD voltage is applied to the input terminal 11, the negative feedback amplifier also operates in the almost same manner as that of the fourth embodiment shown in FIG. 6. Just electric current flowing through the diodes 17A and 18A passes through the common diode 21, and electric current flowing through the diodes 19A and 20A passes through the common diode 22.

The negative feedback amplifier according to the fifth embodiment, as described above, has the common diode 21 connected to both of the diodes 17A and 18A in series, and the common diode 22 connected to both of the diodes 19A and 20A in series. Therefore, it is possible to obtain the same advantage as in the fourth embodiment, as well as to reduce the number of the diode elements for ESD protection, as in the case of the third embodiment.

The present invention is not limited to the above embodiments, but on the contrary, various modifications are possible. The following modifications are conceivable, for example.

(a) The resistance of the feedback resistor and the resistors 16a, 16b and the like constituting the feedback resistor, are not limited to the value described above.

(b) The number of diode elements connected in series for constituting the protective diodes 17, 18 and the like is not limited the above instances. It is necessary to use the proper number of diode elements in accordance with the power source voltage, bias voltage at the input operating point of the amplifier 12 and the like, so that the negative feedback amplifier is not turned into the on-state at a normal input signal level.

(c) The amplifier described in the above embodiments is an amplifier for input which converts the optical signals into the electronic signals and amplifies them. However, the present invention is applicable to any type of amplifier in the same way, as long as it is a negative feedback amplifier with a feedback resistor.

(d) In FIGS. 6 and 7, the polarity of the protective diodes 17 to 20 and the like is fixed, based on the premise that the HEMT in the input stage of the amplifier 12 is weak against the negative ESD. The polarity of the protective diodes 17 to 20 and the like, however, may reverse in response to the characteristics of the input stage of the amplifier 12.

According to the present invention, as described above in detail, a division node is provided at the midpoint of a feedback resistor. A first protective diode is connected between the division node and a first power terminal, and a second protective diode is connected between the division node and a second power terminal. Accordingly, as increase in input capacitance due to the protective diodes is restrained, reduction in a band width is alleviated. The ESD voltage applied to the input terminal bypasses the amplifier, and electric current flows into a power terminal through the protective diode, so that it is possible to effectively protect the amplifier.

What is claimed is:

1. A negative feedback amplifier with a feedback resistor connected between an output terminal and an input terminal of an amplifier, the amplifier being powered from a first power terminal and a second power terminal, the negative feedback amplifier comprising:

a division node between a first resistor on an input terminal side of the amplifier and a second resistor on an output terminal side of the amplifier, the first and second resistors together constitute said feedback resistor;

a first diode having a first electrode connected to said first power terminal, and a second electrode connected to said division node; and a second diode having a first electrode connected to said second power terminal, and a second electrode connected to said division node.

2. The negative feedback amplifier according to claim 1, further comprising:

a third diode having a first electrode connected to said division node, and a second electrode connected to said first power terminal; and a fourth diode having a first electrode connected to said division node, and a second electrode connected to said second power terminal.

3. A negative feedback amplifier with a feedback resistor connected between an output terminal and an input terminal of an amplifier, the amplifier being powered from a first power terminal and a second power terminal, the negative feedback amplifier comprising:

a first division node and a second division node, said first division node provided between a first resistor and a second resistor, and said second division node provided between the second resistor and a third resistor, said first to third resistors being arranged from an input terminal side of the amplifier to an output terminal side of the amplifier in order, and together constituting said feedback resistor;

a first diode having a first electrode connected to said first power terminal, and a second electrode connected to said first division node;

a second diode having a first electrode connected to said second power terminal, and a second electrode connected to said first division node;

a third diode having a first electrode connected to said second division node, and a second electrode connected to said first power terminal; and a fourth diode having a first electrode connected to said second division node, and a second electrode connected to said second power terminal.

4. The negative feedback amplifier according to claim 1, wherein said diodes each comprise a plurality of elements connected in series.

5. The negative feedback amplifier according to claim 2, wherein said diodes each comprise a plurality of elements connected in series.

6. The negative feedback amplifier according to claim 3, wherein said diodes each comprise a plurality of elements connected in series.

7. A negative feedback amplifier with a feedback resistor connected between an output terminal and an input terminal of an amplifier, the amplifier being powered from a first power terminal and a second power terminal, the negative feedback amplifier comprising:

a division node between a first resistor on an input terminal side of the amplifier and a second resistor on an output terminal side of the amplifier, the first and second resistors together constitute said feedback resistor;

a first diode having a first electrode connected to said first power terminal, and a second electrode connected to a connection node;

a second diode having a first electrode connected to said second power terminal, and a second electrode connected to said connection node; and a third diode having a first electrode connected to said connection node, and a second electrode connected to said division node.

8. A negative feedback amplifier with a feedback resistor connected between an output terminal and an input terminal of an amplifier, the amplifier being powered from a first power terminal and a second power terminal, the negative feedback amplifier comprising:

a first division node and a second division node, said first division node provided between a first resistor and a second resistor, and said second division node provided between the second resistor and a third resistor, said first to third resistors being arranged in order from an input terminal side of the amplifier to an output terminal side of the amplifier, and together constituting said feedback resistor;

a first diode having a first electrode connected to said first power terminal, and a second electrode connected to a first connection node;

a second diode having a first electrode connected to said second power terminal, and a second electrode connected to said first connection node;

a third diode having a first electrode connected to said first connection node, and a second electrode connected to said first division node;

a fourth diode having a first electrode connected to a second connection node, and a second electrode connected to said first power terminal;

a fifth diode having a first electrode connected to said second connection node, and a second electrode connected to said second power terminal; and a sixth diode having a first electrode connected to said second division node, and a second electrode connected to said second connection node.

9. The negative feedback amplifier according to claim 7, wherein said first and second diodes each comprise a plurality of elements connected in series.

10. The negative feedback amplifier according to claim 8, wherein said first, second, fourth and fifth diodes each comprise a plurality of elements connected in series.

11. The negative feedback amplifier according to claim 1, wherein said first electrode of each of said diodes is an anode, and said second electrode of each of said diodes is a cathode.

12. The negative feedback amplifier according to claim 3, wherein said first electrode of each of said diodes is an anode, and said second electrode of each of said diodes is a cathode.

13. The negative feedback amplifier according to claim 7, wherein said first electrode of each of said diodes is an anode, and said second electrode of each of said diodes is a cathode.

14. The negative feedback amplifier according to claim 8, wherein said first electrode of each of said diodes is an anode, and said second electrode of each of said diodes is a cathode.

15. The negative feedback amplifier according to claim 1, wherein the amplifier is composed of a high-electron-mobility transistor, and each of said diodes is composed of a Schottky diode formed in a same process as the amplifier.

16. The negative feedback amplifier according to claim 3, wherein the amplifier is composed of a high-electron-mobility transistor, and each of said diodes is composed of a Schottky diode formed in a same process as the amplifier.

17. The negative feedback amplifier according to claim 7, wherein the amplifier is composed of a high-electron-mobility transistor, and each of said diodes is composed of a Schottky diode formed in a same process as the amplifier.

18. The negative feedback amplifier according to claim 8, wherein the amplifier is composed of a high-electron-mobility transistor, and each of said diodes is composed of a Schottky diode formed in a same process as the amplifier.

19. The negative feedback amplifier according to claim 1, wherein resistance of said first resistor is 10 to 100Ω.

20. The negative feedback amplifier according to claim 3, wherein resistance of said first resistor is 10 to 100Ω.

21. The negative feedback amplifier according to claim 7, wherein resistance of said first resistor is 10 to 100Ω.

22. The negative feedback amplifier according to claim 8, wherein resistance of said first resistor is 10 to 100Ω.

* * * * *